(12) United States Patent
Kenington

(10) Patent No.: US 6,429,738 B1
(45) Date of Patent: Aug. 6, 2002

(54) FEED FORWARD AMPLIFIER

(75) Inventor: Peter Kenington, Chepstow (GB)

(73) Assignee: Wireless System International Limited, Bristol (GB)

( * ) Notice: Subject to any disclaimer, the term of this patent is extended or adjusted under 35 U.S.C. 154(b) by 0 days.

(21) Appl. No.: 09/623,576
(22) PCT Filed: Mar. 8, 1999
(86) PCT No.: PCT/GB99/00696
§ 371 (c)(1), (2), (4) Date: Feb. 26, 2001
(87) PCT Pub. No.: WO99/45639
PCT Pub. Date: Sep. 10, 1999

(30) Foreign Application Priority Data

Mar. 6, 1998 (GB) .............................................. 9804744

(51) Int. Cl.$^7$ ................................................. H03F 3/66
(52) U.S. Cl. ......................................... 330/52; 330/151
(58) Field of Search ........................ 330/52, 149, 151, 330/132

(56) References Cited

U.S. PATENT DOCUMENTS

| | | |
|---|---|---|
| 3,922,617 A | 11/1975 | Denniston et al. |
| 4,580,105 A | 4/1986 | Myer |
| 5,621,354 A | 4/1997 | Mitzlaff |
| 5,808,512 A | 9/1998 | Bainvoll et al. |
| 6,052,023 A * | 4/2000 | Myer .............................. 330/2 |
| 6,326,840 B1 * | 12/2001 | Funada et al. ................. 330/52 |
| 6,340,915 B1 * | 1/2002 | Blodgett ........................ 330/52 |

FOREIGN PATENT DOCUMENTS

| | | |
|---|---|---|
| GB | 1 542 081 | 3/1979 |
| GB | 2 080 062 A | 1/1982 |
| GB | 2 296 615 A | 7/1996 |
| GB | 2 238 195 A | 5/1997 |
| WO | WO 86/04469 | 7/1986 |

* cited by examiner

Primary Examiner—Robert Pascal
Assistant Examiner—Henry Choe
(74) Attorney, Agent, or Firm—Kilpatrick Stockton, LLP

(57) ABSTRACT

A feed forward arrangement for linearizing a distorting element such as an amplifier. The arrangement has error correction means which produces an error correction signal that is combined with the output signal of the distorting element to produce a corrected output signal. A pilot signal is injected into the distorting element path so as to be processed by the error correction means and the presence of the pilot signal in the corrected output signal is monitored by comparison with the pilot signal so as to produce another error correction signal to adjust the error correction means. The pilot signal is advantageously derived from the distorting element input signal.

21 Claims, 17 Drawing Sheets

FEED FORWARD AMPLIFIER

BACKGROUND OF THE INVENTION

1. Field of the Invention

This invention relates to a feed forward arrangement for linearising a distorting element. In particular, the distorting element may be an amplifier, with the combination being referred to as a feed forward amplifier.

2. Description of Related Art

In an ideal system, a linear amplifier provides uniform gain throughout its dynamic range in order that the output signal of the amplifier is a correct, amplified version of the input signal. In reality however all linear amplifiers exhibit non-ideal properties such as amplitude and phase distortion, which are undesirable and can seriously deteriorate the performance of a system. One effect of this non-linearity of the amplifier is the generation of output frequencies equal to the sums and differences of integer multiples of the input frequency components. This effect is known as intermodulation distortion (IMD) and is particularly undesirable in high-power radio frequency (RF) amplifiers designed for use in broadband systems. For example, a broadband amplifier used in the TDMA cellular system will generate various intermodulation products as a result of amplifying a multitude of TDMA channels occurring at fixed frequency intervals across a TDMA band, with coincident active frames.

A number of linearisation techniques have been developed to overcome the above distortion problems associated with a linear amplifier. A few of these techniques operate in real-time to account for time dependent changes in the non-linear characteristics of the amplifier. Such changes may result from, for example, temperature variations in the amplifier, ageing of amplifier components, power supply fluctuations, or, most particularly, changes in the operating point of the amplifier due to a change in the number or power of the input carriers. Of the broadband, RF-based linearisation techniques, the two most commonly used are feed forward linearisation and predistorter linearisation.

In general, predistortion linearisation mechanisms involve deliberate alteration of the relatively low level input signal to the amplifier in anticipation of the undesired distortion process occurring within the amplifier. Specifically, the mechanism predistorts the input signal in an inverse sense to the distortion produced by the amplifier such that in series the overall distortion is minimised. Accordingly, the transfer characteristic of the predistorter is approximated as closely as possible to the inverse or complementary function of the transfer characteristic of the amplifier. If the linear amplifier is compressive, i.e. the gain tails off at higher power levels, then the predistorter will compensate for this compression by correspondingly expanding the input signal.

Feed forward linearisation mechanisms rely on creating an error signal representative of the IMD products introduced by the linear amplifier, and feeding this signal forward to combine with the output spectrum of the amplifier, cancelling out the unwanted distortion. In order for the cancellation process to operate correctly, it is necessary for the mechanism to accurately adjust the amplitude and phase of the error signal prior to combining it with the output of the amplifier. To this end, it is known to use pilot signals in the feed forward mechanism as a way of controlling the amplitude and phase adjustments of the error signal. The pilot signals are artificially generated and are added with the amplifier signals to form an artificial "distortion" component of known magnitude and frequency. By monitoring the presence of this artificial distortion in the corrected output spectrum of the amplifier, the errors in the cancellation process can be measured and accounted for by appropriate adjustment of the amplitude and phase of the error signal.

Different types of pilot signals are generated by the feed forward mechanism depending on the category or class of amplifier used/or and the form of input signal to be amplified. For example, in a spread spectrum system, the pilot signal may be chosen to have a frequency range which corresponds to the spread spectrum input signal. In contrast, in a TDMA system, the pilot signal may be chosen such that it fits in the gaps of the input signal frequency spectrum, which will depend on, for example, the channel width and channel spacing of the signal. The appropriate pilot signal is typically generated in a frequency synthesiser which requires control and adds to the feed forward mechanism complexity.

SUMMARY OF THE INVENTION

According to a first aspect of the present invention there is provided a feed forward arrangement for linearising a distorting element, the feed forward arrangement having error correction means in which a reference signal from the distorting element input is compared with the distorting element output signal to produce a first error correction signal, which is combined with the output signal to produce a corrected output signal, and in which a pilot signal is injected into the distorting element path so as to be processed by the error correction means together with the distorting element output signal, the presence of the pilot signal in the corrected output signal being monitored by comparison with the pilot signal so as to produce a second error correction signal, characterised in that the pilot signal is derived from the distorting element input signal or any equivalent signal.

A feed forward arrangement in accordance with the invention has an advantage that acquires the relevant information for the pilot signal directly from the input signal. Therefore, the arrangement does not need to have any prior knowledge about the form, channel spacing or bandwidth of the input signals in order to produce an appropriate pilot signal. A generic hardware implementation of the feed forward arrangement can therefore be produced, for example, in an application specific integrated circuit (ASIC), which can be employed in a variety of frequency bands or systems.

Another advantage of a feed forward arrangement in accordance with the invention is that it does not require any upconversion synthesisers which are normally necessary to generate and detect a pilot signal in a correct frequency band for the distorting element. The pilot signal can automatically concentrate on the area of the spectrum in which the input signals appear, providing maximum benefit where it is needed. If, for example, the input signals were concentrated in the lower half of a designated band of operation, then the feed forward arrangement would automatically be optimised for use in that part of the band. In contrast, prior art solutions are in general optimised in a predetermined portion of the band such as, for example, the whole of the band for a spread spectrum based pilot signal.

A further advantage of a feed forward arrangement in accordance with the invention is that the bandwidth of the pilot signal can be automatically related to the bandwidth of the input signal(s). In this way, the pilot energy will be concentrated in the area of spectrum where it is required and does not spread outside that region. Consequently, it is not necessary to remove any pilot signal appearing outside of the band (by filtering or otherwise) which can result in cost reduced system.

In one embodiment in accordance with the first aspect of the invention, the pilot signal is derived by modulation of the input signal with a modulating signal. Alternatively, the pilot signal can be derived as a third order or higher component of the input signal. Suitably, the input signal is attenuated in the pilot signal.

In a preferred embodiment, a frequency offset is applied to the pilot signal prior to the pilot signal being injected into the distorting element path. This frequency offset can be applied by mixing the pilot signal with a relatively low frequency tone signal from a local oscillator.

Preferably, the distorting element comprises an amplifier such as a broadband radio frequency power amplifier.

The error correction means can include means for adjusting the first error correction signal in dependence on information contained in the second error correction signal, and the adjustment means can enable adjustment of the first error correction signal in phase and amplitude. Accordingly, the adjustment means may comprise a variable phase shifter and a variable attenuator, or it may comprise an in-phase adjustment means and a quadrature phase adjustment means.

The feed forward arrangement may provide for dual feed forward correction whereby the feed forward arrangement has a second error correction means, independent of the first error correction means, which produces a third error correction signal for combining with the distorting element output signal to further correct the output signal, and in which a second pilot signal is injected into the distorting element path, the presence of the second pilot signal in the further corrected output signal being monitored by comparison with the second pilot signal so as to produce a fourth error correction signal, wherein the second pilot signal is also derived from the distorting element input signal.

According to a second aspect of the present invention there is provided a method for linearising a distorting element, including a comparing step in which a reference signal from the distorting element input is compared with the distorting element output signal to produce a first error correction signal, a combining step in which the first error correction signal is combined with the output signal to produce a corrected output signal, and an injecting step in which a pilot signal is injected into the distorting element so as to be processed together with the distorting element output signal by the comparing step, the presence of the pilot signal in the corrected output signal being monitored by comparison with the pilot signal so as to produce a second error correction signal, characterised in that the pilot signal is derived from the distorting element input signal or any equivalent signal.

According to a third aspect of the present invention there is provided an apparatus for correcting distortion generated in a distorting element, comprising comparing means for coupling to an input and an output of the distorting element for comparing a signal from the element input with a signal from the element output to produce an error signal, correcting means, coupled to the comparing means, for adjusting the error signal to produce a correction signal which is combined with the output signal of the element to produce a corrected output signal, means for deriving a distortion signal from the distorting element input signal, which distortion signal is a third order or higher component of the input signal, and control means for comparing the corrected output signal with the pilot signal so as to produce a control signal which controls the adjustment of the error signal in the correcting means.

According to a fourth aspect of the present invention there is provided a method for correcting distortion generated at an output of a distorting element, comprising the steps of comparing a signal from the distorting element input with a signal from the distorting element output to produce an error signal, adjusting the error signal to produce a correction signal which is combined with the output signal of the distorting element to produce a corrected output signal, deriving a pilot signal from the distorting element input signal, which pilot signal is a third order or higher component of the input signal, and comparing the corrected output signal with the pilot signal so as to produce a control signal which controls the adjustment of the error signal in the correcting means.

Further features and advantages of the invention will be apparent from the description below.

BRIEF DESCRIPTION OF THE DRAWINGS

Embodiments of the invention will now be described, by way of example, with reference to the accompanying drawings, in which.

DETAILED DESCRIPTION OF THE PREFERRED EMBODIMENTS

Basic Feed Forward Amplifier

Figure 1:
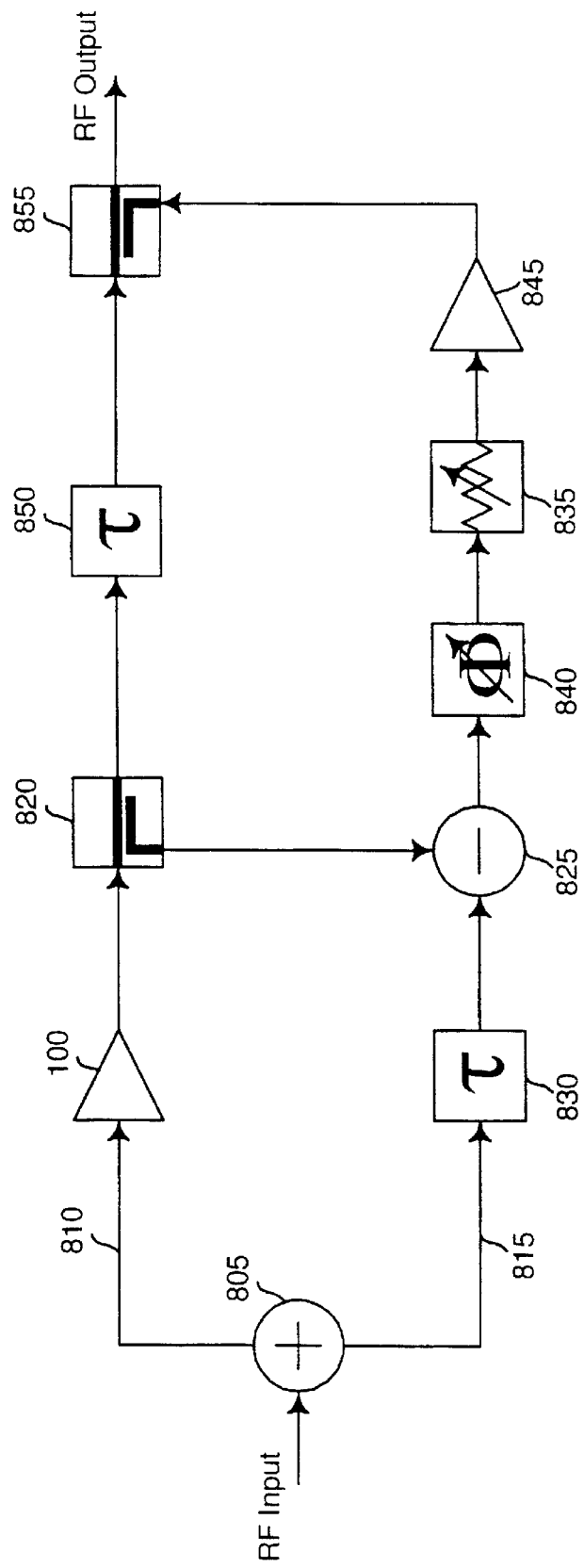
FIG. 1 is a block diagram of a feed forward amplifier.

FIG. 1 is a block diagram of a feed forward arrangement 800 for linearising an amplifier 100. The specific type of amplifier 100 is not significant to the operation of the feed forward arrangement 800, and may range from a simple amplifier to a composite or an internally controlled amplifier. The feed forward arrangement 800 is coupled to an input of the amplifier for receiving signals input to the amplifier, and coupled to an output of the amplifier for receiving signals output from the amplifier.

The feed forward arrangement 800 has an input for receiving a radio frequency (RF) input signal which is required to be amplified. This RF signal is divided by a splitter 805 into a main amplifier path 810 and a reference path 815. The RF signal entering the main amplifier path 810 is fed into an input of the amplifier 100, and the subsequent output of the amplifier 100 provides a linearly amplified version of the input signal together with distortion components. The RF signal entering the reference path 815 contains the same information as the signal entering amplifier 100 and can therefore be considered to represent the amplifier input signal.

The output signal from the amplifier is sampled by the directional coupler 820 to form a signal which represents a lower amplitude version of the amplifier output. This sample signal is supplied to a non-inverting input of a subtractor 825. The second inverting input of the subtractor is supplied with the reference signal via a time delay component 830 to ensure it coincides with the sample signal. The subtractor 825 subtracts the reference signal, which represents the amplifier input signal, from the sample signal, which represents the amplifier output signal. This subtraction process cancels the linearly amplified version of the input signal in the sample signal to provide an output signal containing only the intermodulation distortion components from the sample signal. The subtraction process is therefore equivalent to a comparison of the amplifier output with the amplifier input to detect what distortion if any has been introduced by the amplifier. In fact, the subtraction process detects any distortion generated in the main amplifier path 810, defined as the path between the splitter 805 and the directional coupler 820, which in this case only contains the amplifier 100. The output signal from the subtractor 825 represents the distortion generated by the amplifier and may be referred to as an error signal.

The error signal is adjusted in amplitude and phase by the variable attenuator 835 and the variable phase shifter 840 respectively, and is subsequently amplified by a fixed gain RF amplifier 845 to form a correction signal which is fed into a directional coupler 855. Meanwhile, the output signal of the amplifier containing unwanted distortion components is supplied via an appropriate time delay 850 to a second input of the directional coupler. The directional coupler functions as an adder for adding the correction signal to the amplifier output signal. The error signal is adjusted in amplitude and phase to ensure that the cancellation signal is set at a correct level and 180 degrees out of phase with the amplifier output signal so as to maximise cancellation of the unwanted distortion components in the amplifier output signal. The resultant output signal from the feed forward amplifier is a linearly amplified version of the RF input with minimised distortion.

Feed Forward Amplifier With Pilot

Figure 2:
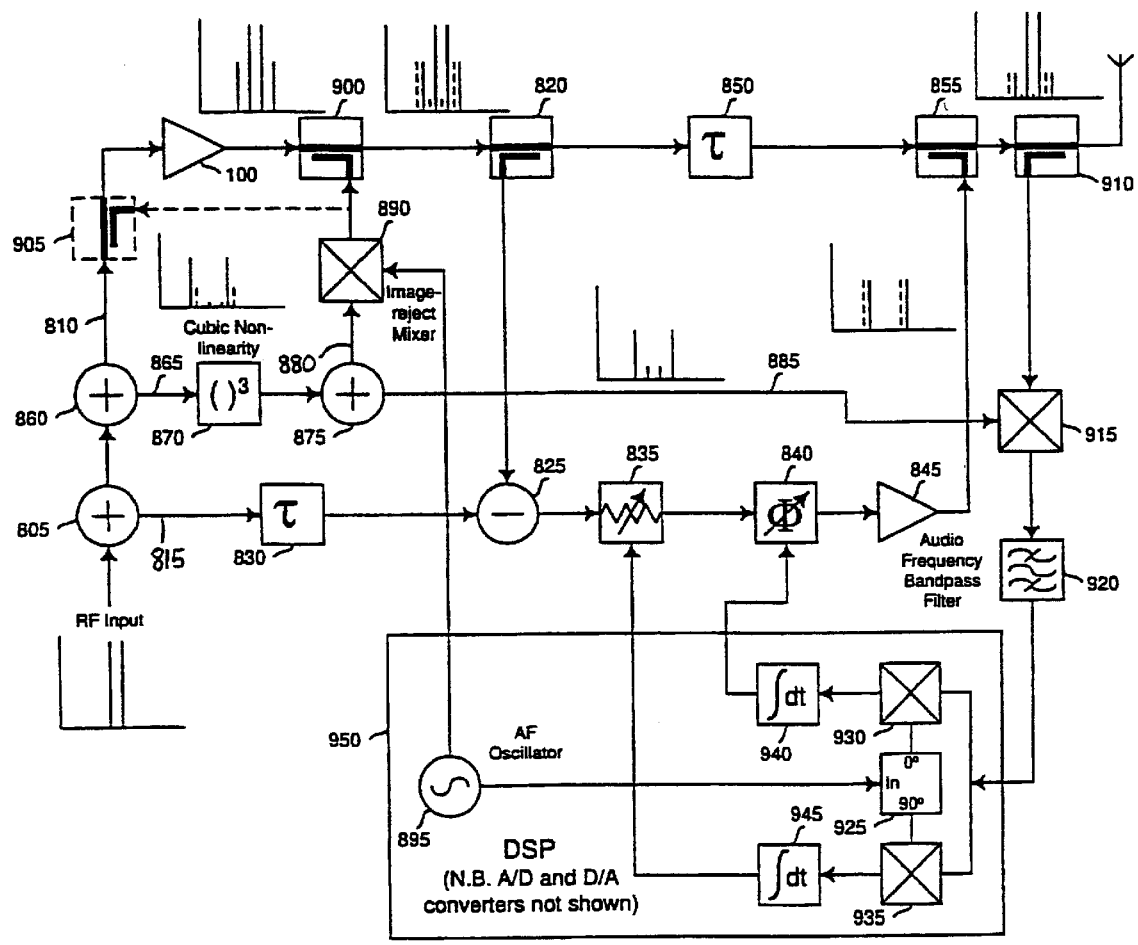
FIG. 2 is a block diagram of a feed forward amplifier in accordance with the invention.

FIG. 2 is a block diagram of the feed forward amplifier of FIG. 1 modified to include a pilot tone control mechanism. FIG. 2 also includes frequency spectra which illustrate the response of the feed forward amplifier to a two tone RF input signal in various signal paths.

The pilot tone control mechanism provides improved control of the feed forward amplifier and operates as follows. A second splitter 860 divides the RF input signal, supplied as an output of the first splitter 805, into a pilot signal path 865. Like the reference path, the RF signal entering the pilot signal path 865 contains the same information as the signal entering amplifier 100 and can therefore be considered to represent the amplifier input signal. The position of the splitter 860 may be changed without effecting the information content of signal supplied to the pilot signal path 865. For example, the splitter 860 could be positioned before the splitter 805, or could be positioned in the reference path 815.

The RF signal entering the pilot signal path is fed into a pilot signal processor 870 which generates a pilot signal output based on the RF signal. The processing techniques employed in the pilot signal processor may vary depending on, for example, the overall system specifications. However, a feature common to all of the various processing techniques is that the resultant pilot signal is in some way derived from the RF input. Another feature that may be common to all of the techniques is that the resultant pilot signal is distinctive or unique over the RF signal, ie. the process decorrelates the pilot signal from the RF input. In FIG. 2, the pilot signal processor derives an in-band third order distortion component from the RF input. The various different processing techniques will be discussed in more detail.

The third order pilot signal derived from the RF input signal and output from the pilot signal processor is split into two paths by a splitter 875. One path 880 injects the pilot signal into the main amplifier path 810, and the other path 885 is used in detecting the presence of the pilot signal in the corrected amplifier output. The pilot signal in the injection path is frequency offset by an relatively small frequency $f_{AF}$ (e.g. 1 kHz). This frequency offset or translation takes place in the image reject mixer 890 by mixing the pilot signal with an audio tone signal $f_{AF}$ from an audio frequency (AF) oscillator 895. The AF oscillator 895 operates in the digital domain of a digital signal processor 950 and supplies the audio tone signal $f_{AF}$ via a digital to analogue converter (not shown). The resulting pilot signal is equivalent to the original pilot signal but is shifted in frequency. The AF oscillator does not necessarily have to be located in the DSP, and could alternatively be, for example, an analogue oscillator.

A directional coupler 900, positioned adjacent the output of the amplifier 100, is used to inject the frequency offset pilot signal into the main amplifier path 810. Alternatively, the frequency offset pilot signal can be injected or added into the main amplifier path 810 adjacent the input of the amplifier 100 using the directional coupler 905 (shown in dotted lines in FIG. 2). The use of a frequency offset is particularly advantageous for pilot signals derived as third order components of the RF input (ie. amplifier input) as they are offset from similar third order distortion components generated by the amplifier 100.

In the feed forward arrangement, the comparison process occurring in the subtractor 825 cannot distinguish between distortion generated in the main amplifier path and the pilot signal intentionally injected into the main amplifier path. These pilot signals are sampled together with the amplifier output in the directional coupler 820 and are treated as distortion by the feed forward error correction process. Accordingly, the error signal will contain components representing the level of pilot signal energy in the signal passing through the directional coupler 820. Adjustment of these components in the variable attenuator 835 and the variable phase shifter 840 results in a correction signal which attempts to eliminate the pilot signal energy in the directional coupler 855.

The degree of elimination of the pilot signal energy achieved is indicative of the degree of elimination of the unwanted distortion signals in the amplifier output. Therefore, it follows that a feed forward amplifier which is correctly adjusted will produce less residual pilot signal at its output than a badly adjusted feed forward amplifier. By minimising the residual pilot signal energy in the feed forward amplifier output, the overall performance of the feed forward arrangement can be optimised.

The feed forward amplifier of FIG. 2 operates to minimise the residual pilot energy by means of a feed back loop. This feed back loop generates an error correction signal based on detection of the residual pilot signal present at the feed forward amplifier output. The error correction signal is fed back to control the adjustment of the error signal in amplitude and phase by the variable attenuator 835 and the variable phase shifter 840 respectively.

The feed forward amplifier output spectrum is sampled by the directional coupler 910 and is fed into the mixer 915. A second input of the mixer receives the non-offset pilot signal from the path 885, which may be referred to as the reference pilot signal. The mixer performs a correlation process on the two inputs to generate an output signal which contains information regarding the overlap of the reference pilot signal with the residual pilot signal contained in the output spectrum sample. Because the residual pilot signal is offset from the reference pilot signal by the frequency $f_{AF}$, the relevant information from the correlation process will be an feedback signal at this frequency $f_{AF}$. The amplitude and phase of the feedback signal represents information concerning the cancellation of the pilot signal in the directional coupler 855. Without using an image reject mixer 890, the phase information in the feedback signal would be lost as the feedback signal would be a composite signal containing correlated signals from the higher and lower frequency images which would destroy the phase information present.

The correlation signal containing the required feedback signal is filtered in the audio frequency bandpass filter 920 (centred on the frequency $f_{AF}$) to attenuate unwanted correlation signal components. The output of the filter 920 is then fed via an analogue-to-digital converter (not shown) into the inputs of quadrature mixers 930 and 935 located in the digital signal processor (DSP).

The fixed audio frequency (AF) oscillator 895, operating in the digital domain of the digital signal processor (DSP) 950, provides a tone signal of frequency $f_{AF}$ to a phase quadrature component 925, which in turn operates to supply an in-phase version of the tone signal to a second input of the mixer 930 and a quadrature phase version of the tone signal to a second input of the mixer 935. The output of the mixer 930 contains, in addition to unwanted frequency components, a DC signal which represents the projection of the feedback correction signal on the in-phase version of the tone signal. In contrast, the output of the mixer 935 contains, in addition to unwanted frequency components, a DC signal which represents the projection of the feedback signal on the quadrature phase version of the tone signal. The unwanted frequency components from the mixers 930 and 935 are removed by the integrators 940 and 945 respectively to generate two smoothed DC control signals for respectively controlling the variable attenuator 835 and the variable phase-shift component 840. The DC signals from the mixers 930 and 935 will vary as the feedback loop adjusts the phase and amplitude of the feedback signal to minimise the pilot signal energy in the output spectrum. The feedback loop will eventually reach a steady state whereby any deviation of the pilot signal energy from the minimum will result in a corresponding adjustment of the error signal to counteract the change.

It should be noted that the digital signal processor and the analogue-to digital converter are ideally suited to dealing with signals at audio frequency and can therefore accurately process the required feedback signal component at the tone frequency $f_{AF}$. The digital quadrature mixers 930 and 935 mix the correlation signal with the AF tone signal from the AF fixed oscillator 895 to convert the required feedback signal also at the tone frequency into two independent control DC signals. This offset-frequency mechanism is immune to any build up of spurious DC signals in the analogue domain, i.e. from the mixer 915 or the band-pass filter 920. The potentially damaging DC signals enter the digital signal processor via the analogue to digital converter (not shown), but are immediately converted to the tone signal frequency $f_{AF}$ by the digital mixers 930, 935 and are subsequently cancelled in the integrators 940, 945. Because the digital mixers 930, 935 and the integrators 940, 945 all operate in the digital domain of the digital signal processor (DSP) they do not experience the problems of their analogue counterparts such as signal leakage or spurious DC offset generation due to temperature or power supply fluctuations. The system is therefore stabilised against temperature effects, signal level changes or ageing effects.

Image Reject Mixer

The image reject mixer 890 may be provided using a variety of techniques. However, many of these techniques are complex, requiring, for example, quadrature networks which operate using RF and multi-tone local oscillators.

Figure 3:
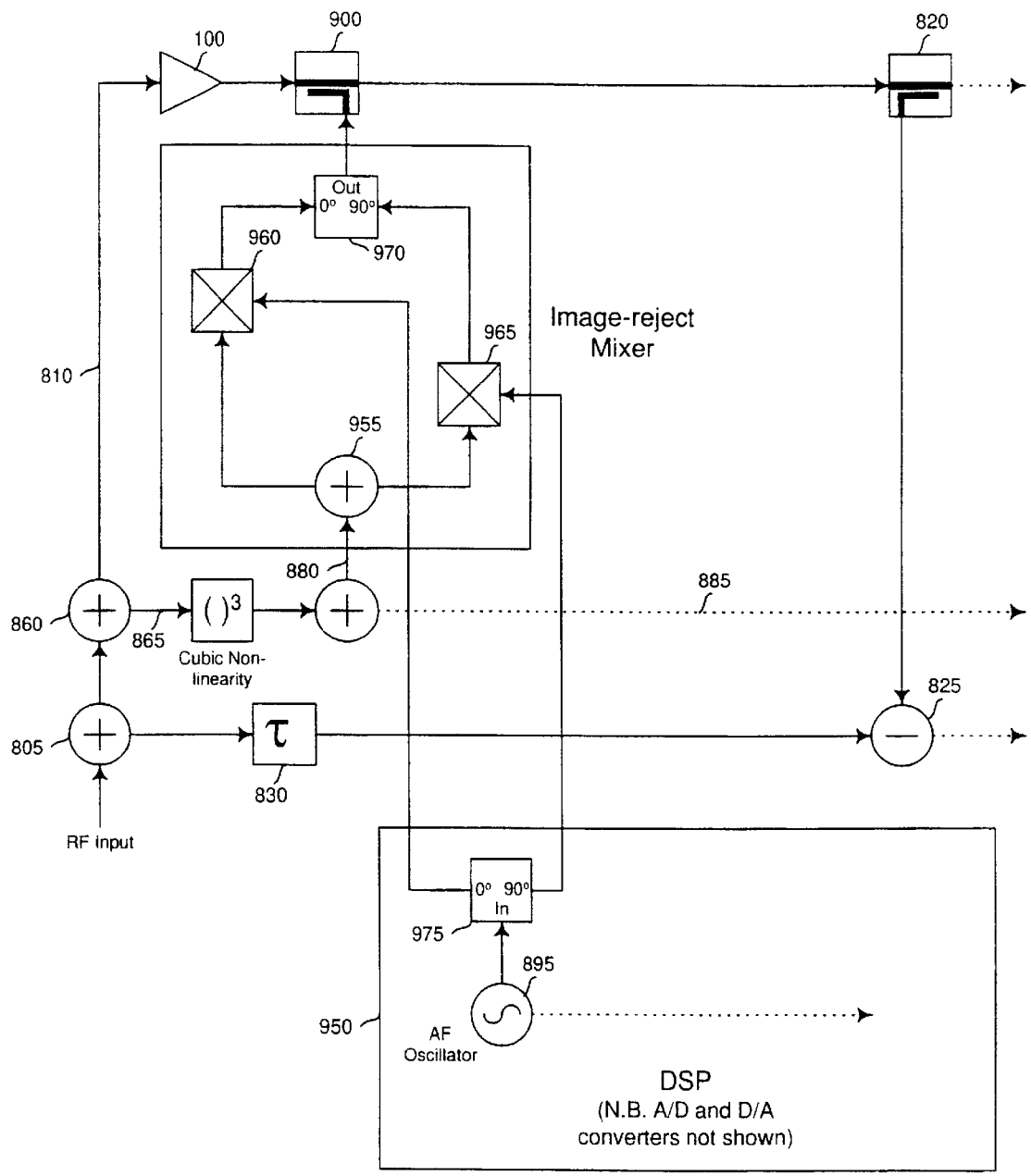
FIG. 3 is a block diagram of a circuit arrangement for the image reject mixer of FIG. 2.

FIG. 3 shows an advantageous embodiment of an image reject mixer for use in the feed forward arrangement of FIG. 2. The pilot signal in the injection path 880 is split by the splitter 955, and the two divided paths are fed into the two quadrature mixers 960 and 965. The second inputs of the mixers 960 and 965 are fed with in-phase and quadrature phase versions of the audio frequency tone $f_{AF}$ respectively. Finally, the output of the quadrature mixers 960 and 965 are combined in the phase quadrature adder 970. It can be shown that the lower frequency image generated in the quadrature mixer 965 has a 90 degree phase lag relative to the lower frequency image generated in the mixer 960. Accordingly, when these two images combine in the phase quadrature adder 970 they reinforce each other. In contrast, the higher frequency image generated in the quadrature mixer 965 has a 90 degree phase advance relative to the higher frequency image generated in the mixer 960. Accordingly, when these two images combine in the phase quadrature adder 970 they cancel with each other. In other words the higher frequency image is rejected.

The in-phase and quadrature phase versions of the audio frequency tone $f_{AF}$ are generated in the DSP 950 using a digital phase quadrature process 975. This has an advantage that it provides a near perfect audio frequency quadrature. It also has a further advantage that the digital phase quadrature process 975 can be finely adjusted in software to account for any imperfections in the analogue quadrature mixers 960 and 965, and particularly the phase quadrature adder 970 which performs quadrature phase shifts on broadband radio frequency (RF) signals. These fine adjustments may be performed during an initial calibration procedure.

Control of Error Loop

Referring again to FIG. 1, the subtraction process occurring in the subtractor 825 relies on the reference signal and the sample signal coinciding in the correct phase relationship and at the correct amplitude to provide proper cancellation of the input signal energy in the error signal. In practice this is achieved by appropriate control of the amplitude and phase of either the amplifier input signal or the reference signal. It is also possible to control the amplitude and phase of the output signal of the amplifier or the sample signal from the directional coupler 820.

Figure 4:
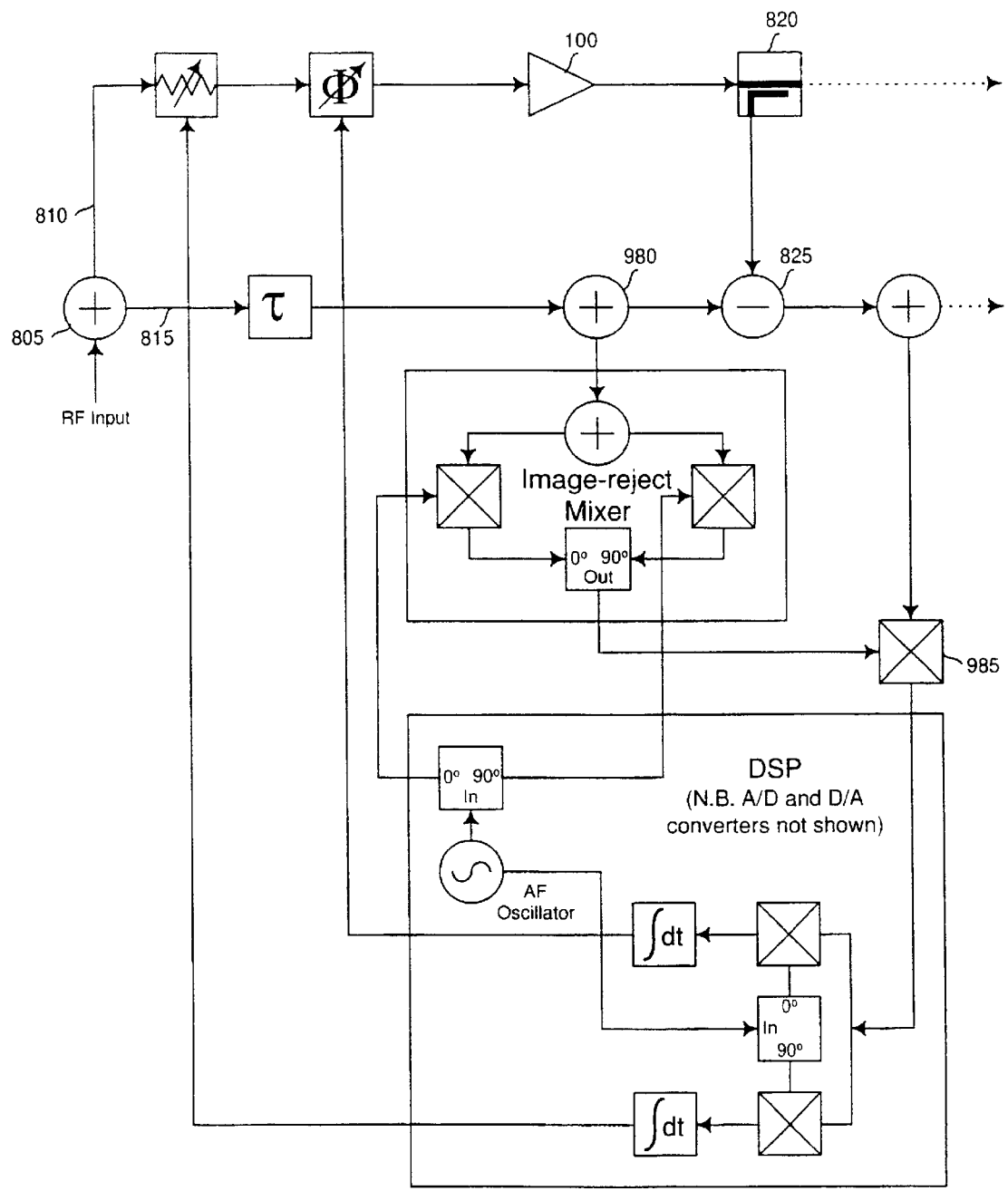
FIG. 4 is a block diagram of a circuit for controlling the generation of the error signal in FIGS. 1 and 2.

FIG. 4 shows a block diagram of a circuit for controlling the amplitude and phase of the amplifier input signal to provide maximum cancellation of the input signal energy in the error signal. The image reject mixer previously described with reference to FIG. 3 receives from a splitter 980 a time delayed RF input signal from the reference path 815 and provides a frequency offset version of the RF input signal to a mixer 985. The error signal is correlated with this reference signal to provide a correlation output containing a signal representing the amplitude and phase of the residual input signal energy in the error signal. This signal is a tone signal at the offset frequency, and is processed by the DSP to control the amplitude and phase of the amplifier input signal using similar techniques as those described with reference to the pilot control in FIG. 2.

The advantage of this circuit is that it eliminates any need for RF frequency synthesisers whilst maintaining the advantages of DSP based error signal detection over analogue equivalents.

Modified Feed Forward Amplifiers

Figure 5:
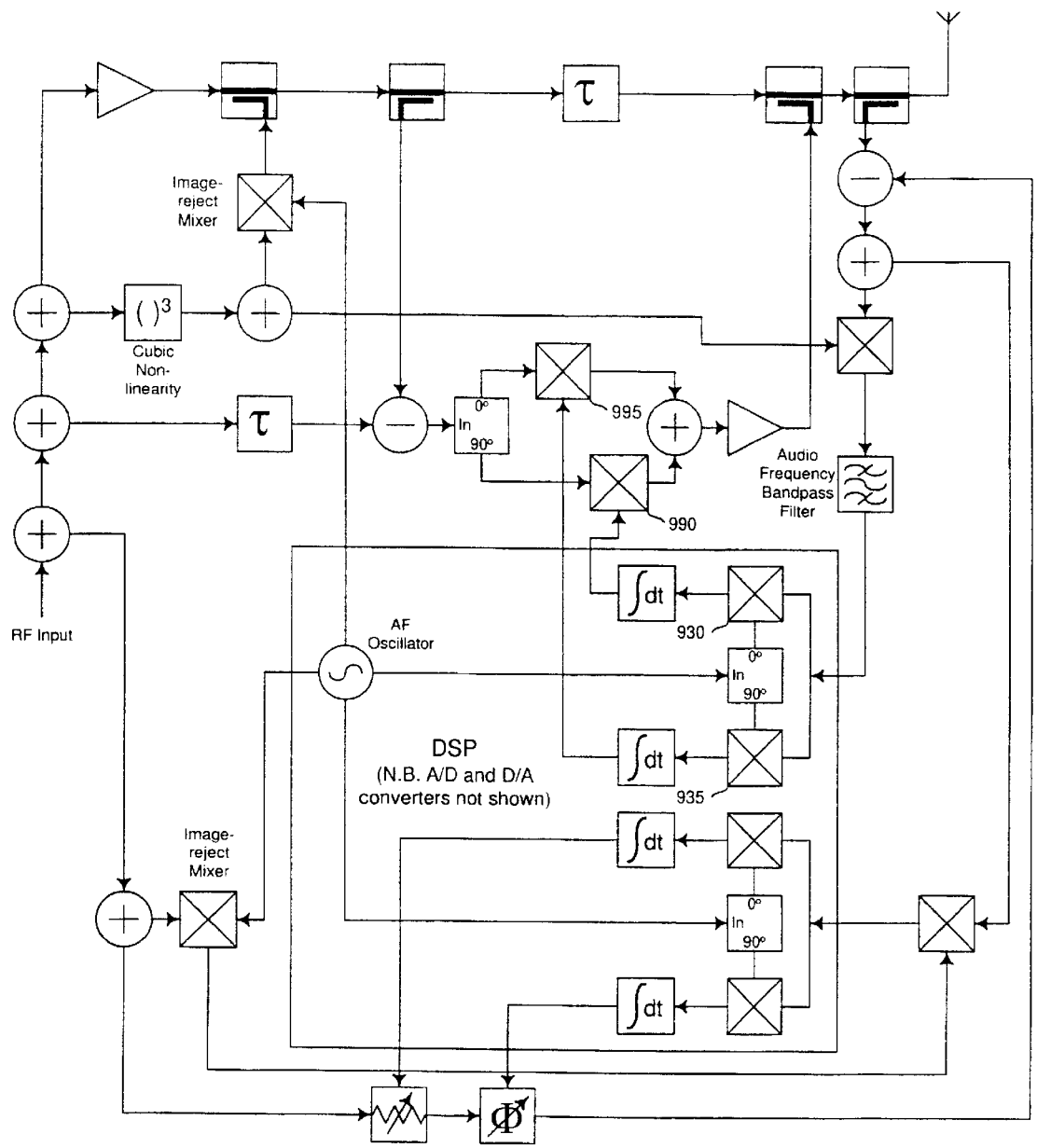
FIG. 5 is a block diagram of a modified version of the feed forward amplifier of FIG. 2.

FIG. 5 shows a block diagram of a modified version of the feed forward amplifier of FIG. 2. One modification is the use of quadrature mixers 990 and 995 to provide vector control of the amplitude and phase of the error signal. The mixer 930 and the mixer 935 receive different quadrature version of the audio frequency tone $f_{AF}$ and operate to control the mixer 990 in the quadrature channel of the error signal adjustment, and the mixer 995 in the in-phase channel of the error signal adjustment.

Another modification to the feed forward circuit of FIG. 2 is the inclusion of circuitry for eliminating some of the main signal energy sampled by the directional coupler 910 in the feed back loop. This is advantageous as it eliminates unwanted spurious correlation signals which, although theoretically insignificant, may cause a dynamic range based limitation of the control system performance. It is therefore beneficial to eliminate as much of this main signal energy as possible by means of the automatic control mechanism shown in FIG. 5.

The automatic control mechanism operates as follows. A splitter (or coupler) obtains a sample of the RF input to the feed forward amplifier. This sample is split, with one portion undergoing gain and phase control prior to being used to cancel the main signal energy present in the sampled feed forward amplifier output spectrum. The other portion undergoes a small frequency translation, by means of an image reject mixer and a DSP generated audio frequency oscillator, prior to correlation with the output signal sample, after the main signal subtraction has taken place. The resultant correlation signal includes a signal tone with information on the phase and amplitude of the residual (uncancelled) main signal energy appearing in the output sample. The signal tone is then detected in I and Q components within the DSP to derive gain and phase control signals for the elements controlling the main signal cancelling process. The mechanism results in minimisation of the main signal components in the output signal sample and thereby improves the dynamic range of the pilot correlation in the mixer 915.

Dual Feed Forward Control

The feed forward techniques described previously with reference to FIGS. 1 to 5 can be extended to a pilot control scheme employing a dual feed forward correction system, either by using the same pilot signal for each correction, or by using a second pilot signal for the second correction process. The second pilot signal could use a higher order of distortion derived from the input signal such as fifth or seventh order, or a different offset frequency from the DSP based oscillator, or a combination of both.

Figure 6:
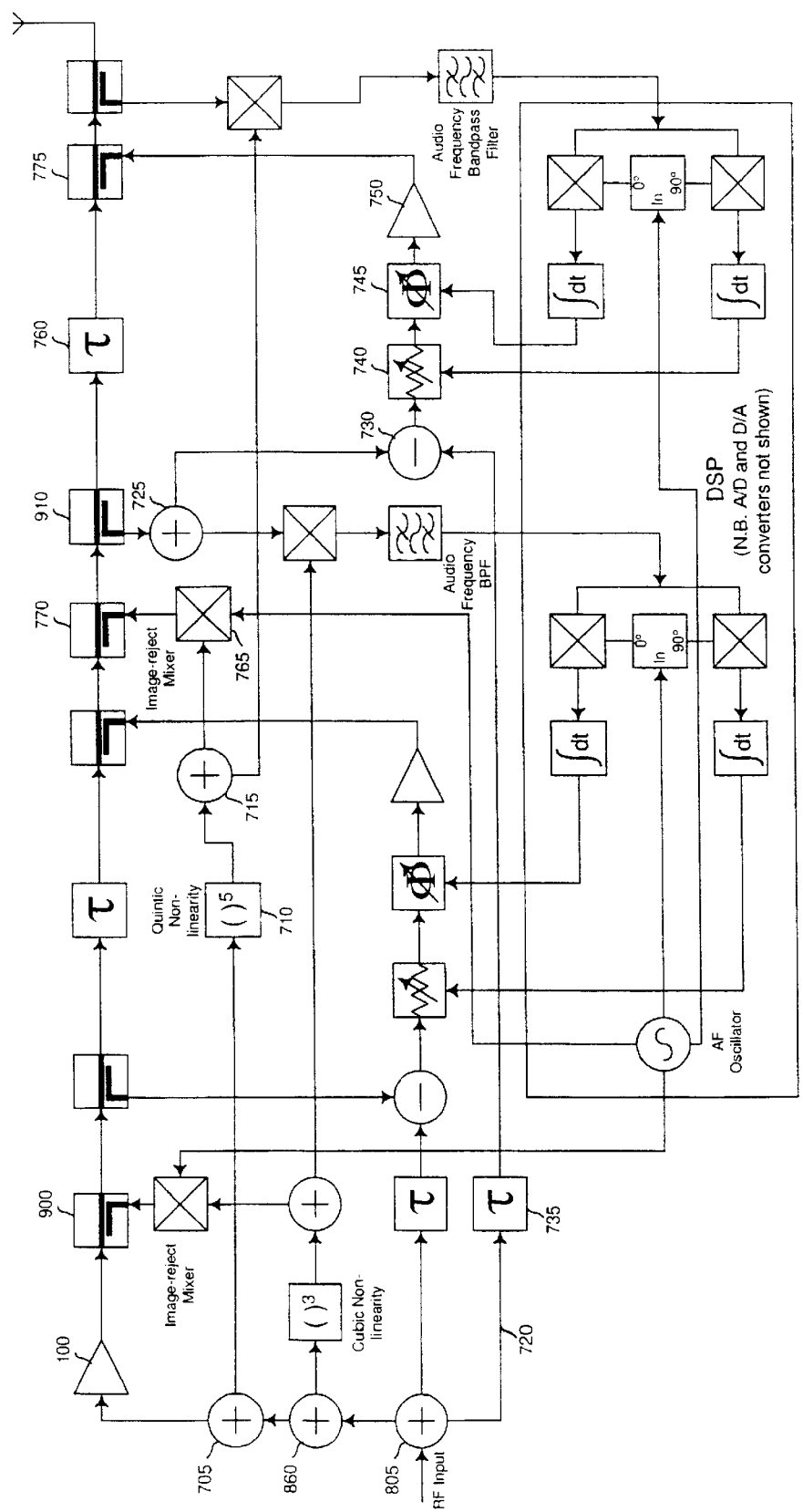
FIG. 6 is a block diagram of another modified version of the feed forward amplifier of FIG. 2.

An example of a system using a single offset frequency and different orders of distortion in the two pilot signals is shown in the block diagram of FIG. 6. The principle of operation is similar to that described previously, with independent control being provided for the two feed forward processes.

The feed forward amplifier of FIG. 6 is based on a modified version of the feed forward amplifier of FIG. 2 and includes a second feed forward mechanism. The splitter 705 feeds the RF input signal into a second pilot signal path containing a second pilot signal processor 710. This processor derives a second pilot signal as a fifth order distortion signal based on the RF input signal and this second pilot signal is split into two paths by a splitter 715. One path injects the second pilot signal into the main amplifier path, and the other path is used in detecting the presence of the second pilot signal in the corrected amplifier output.

The splitter 805 feeds the RF input signal into a second reference path 720. The RF signal entering the second reference path 720 contains the same information as the signal entering amplifier 100 and can therefore be considered to represent the amplifier input signal.

The corrected output signal from the amplifier 100 is sampled by the directional coupler 910 in the first feed forward mechanism to form a signal for detecting residual first pilot signals. However, this sample signal is also supplied via a splitter 725 to a non-inverting input of a subtractor 730 of the second feed forward mechanism. The second inverting input of the subtractor 730 is supplied with the second reference signal via a time delay component 735 to ensure it coincides with the sample signal. The subtraction process which occurs in the subtractor 730 is equivalent to that performed in the subtractor 875 and the resultant second error signal represents the residual distortion generated by the amplifier remaining in the corrected output signal.

The second error signal is adjusted in amplitude and phase by the variable attenuator 740 and the variable phase shifter 745 respectively, and is subsequently amplified by a fixed gain RF amplifier 750 to form a second correction signal which is fed into a directional coupler 755. The corrected output signal of the amplifier still containing unwanted residual distortion components is supplied via an appropriate time delay 760 to a second input of the directional coupler. The directional coupler functions to provide a further cancellation of the unwanted distortion contained in the corrected output signal.

Referring back to the second pilot signal in the injection path, this signal is frequency translated by an relatively small frequency $f_{AF}$ (e.g. 1 kHz) by the image reject mixer 765. A directional coupler 770, positioned adjacent the output of the amplifier 100, is used to inject the second pilot signal into the main amplifier path. The second pilot signal could also be injected or added into the main amplifier path 810 adjacent the input of the amplifier 100, or indeed anywhere in the main amplifier path between the splitter 805 and the directional coupler 910. A particularly useful position for injecting the second pilot signal would be after the directional coupler 820 so as to minimise the effect of the second pilot tone on the first error signal generation.

It is apparent that the dual feed forward mechanism may also incorporate the feed forward techniques referred to earlier, such as the main signal removal technique illustrated in FIG. 5.

Direct Detection and Control

Figure 7:
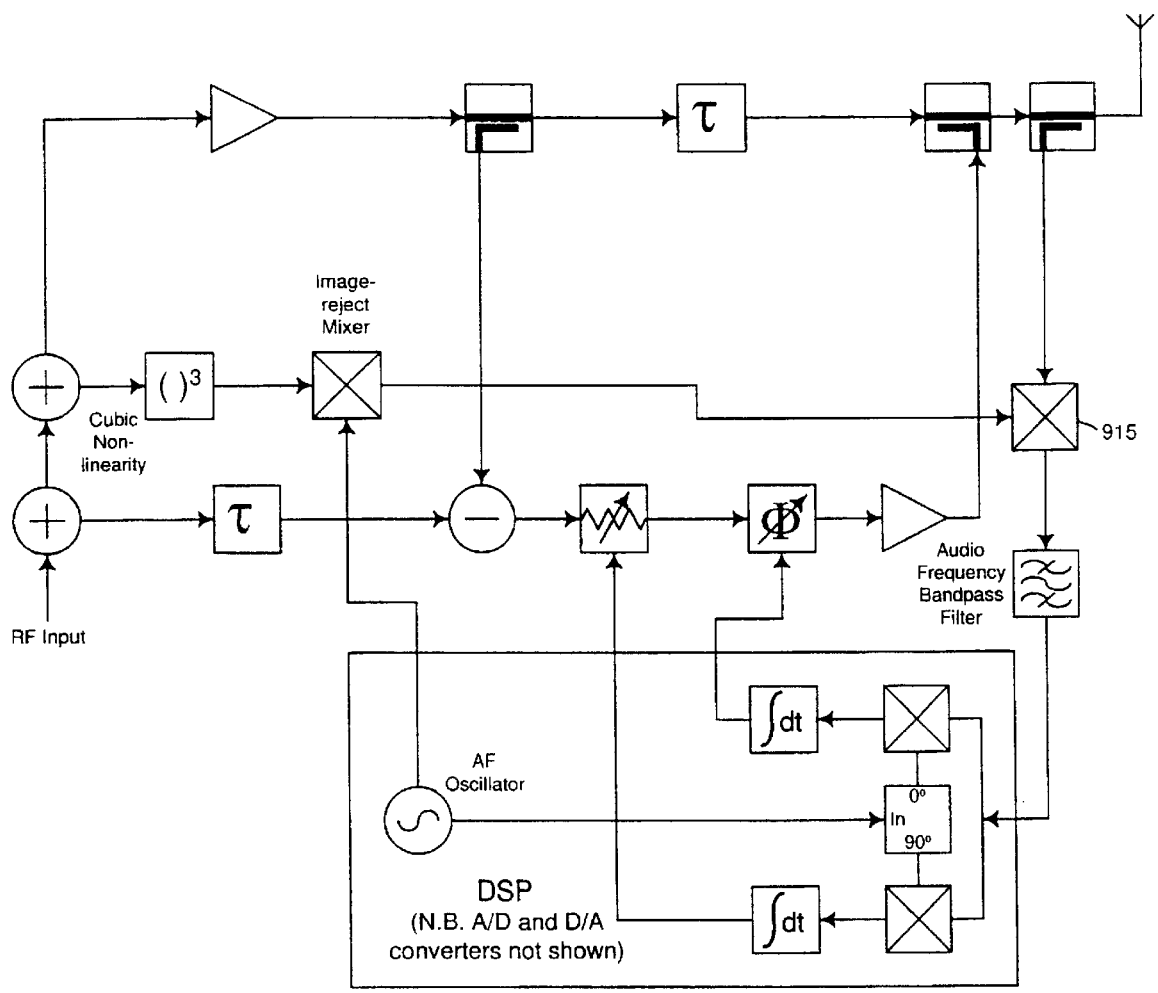
FIG. 7 is a block diagram of another feed forward amplifier.

A variant on the feed forward mechanism of FIG. 2 which incorporates the mechanism of FIG. 1 is shown in FIG. 7. The main distortion generated in the amplifier 100 is intermodulation distortion (IMD) which will result in predominantly third order components of the RF input signal appearing in the amplifier output signal. Pure third order distortion signals derived from the RF input separately from the amplifier can therefore be used to directly detect the unwanted residual distortion in the corrected output. This detection process together with an offset frequency control technique similar to that used in the circuit of FIG. 2 are included in the circuit of FIG. 7.

The circuit relies on a good correlation in the mixer 915 between the derived, frequency offset third order distortion and the third order IMD distortion in the corrected output signal. Correlation between the main signal energy in the corrected output and RF input energy which may leak into the derived third order distortion should therefore be kept as low as possible. This may be achieved by suppressing the main signal energy in the sample of the corrected output using the technique described previously with reference to FIG. 5. The RF input energy in the third order distortion signal should also be minimised as will be described.

An advantage of this mechanism over the pilot mechanism of FIG. 2 is that there is one less coupler in the main amplifier path which results in reduced signal loss and hence improves the efficiency of the amplifier.

Another advantage of this mechanism is that it does not add additional signals to the main amplifier path which can interfere with the main signals, and which require error amplifier power to remove and injection amplifier power to inject.

Deriving a Pilot Signal in the Pilot Signal Processor

In FIGS. 2, 3, 5, and 6, the pilot signal processor 870 is implemented as a cubic non-linearity generator which derives in-band third order components from the input signal. However, the pilot signal may be derived in any manner from the RF input signal, provided that the pilot signal is made unique or different from the RF input signal. Another implementation of the pilot signal processor 870 could therefore be a modulator which modulates the input signal with a known or predetermined modulating signal. The modulation scheme could be amplitude, frequency or phase modulation, and the known modulating signal could be a fixed tone or a pseudo random sequence.

Pilot signal processors which derive third or fifth order components of the RF input signal for use in the feed forward arrangements of FIGS. 2, 3, 5, and 6 will now be described, with reference to the block diagrams shown in FIGS. 8 to 16.

Figure 11:
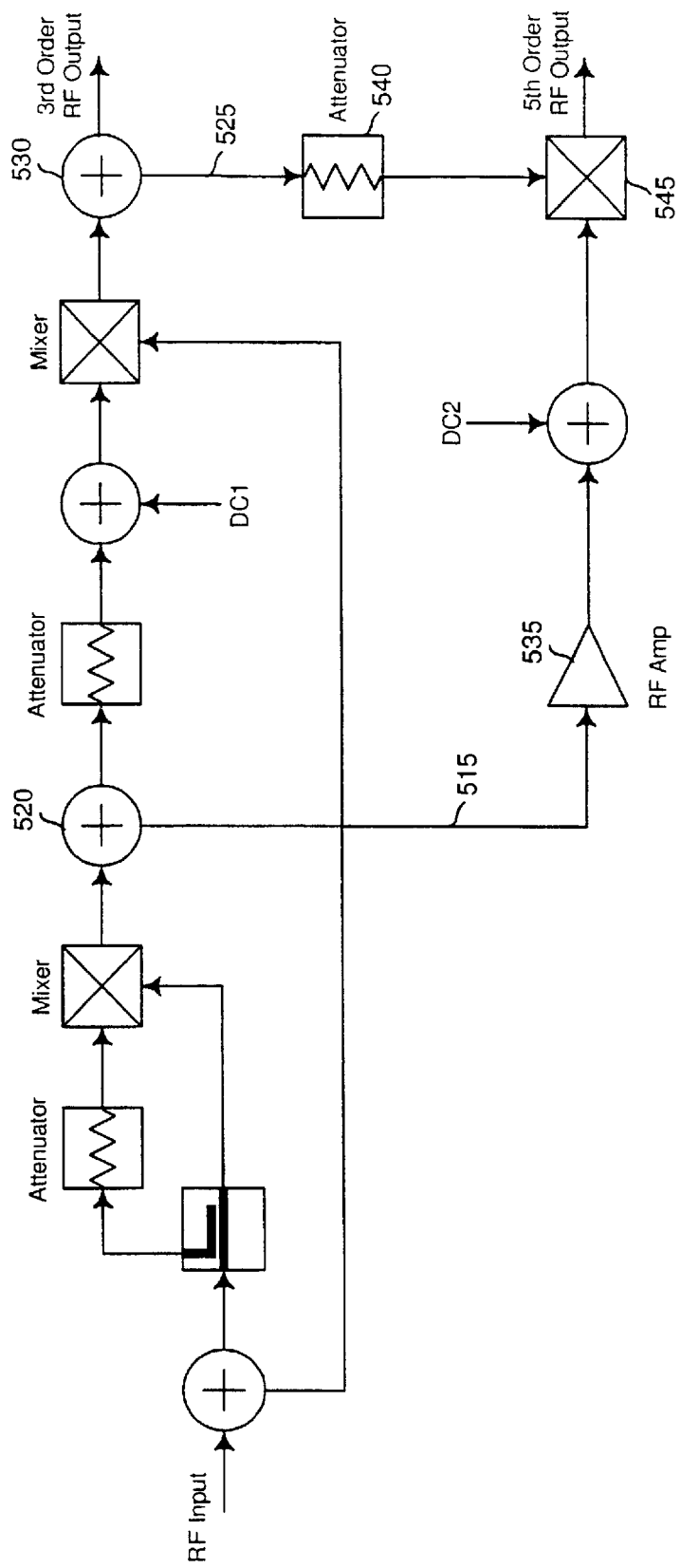
FIG. 11 is a block diagram of a circuit for generating third and fifth order distortion components suitable for use in the feed forward amplifier of FIG. 6.
Figure 17:
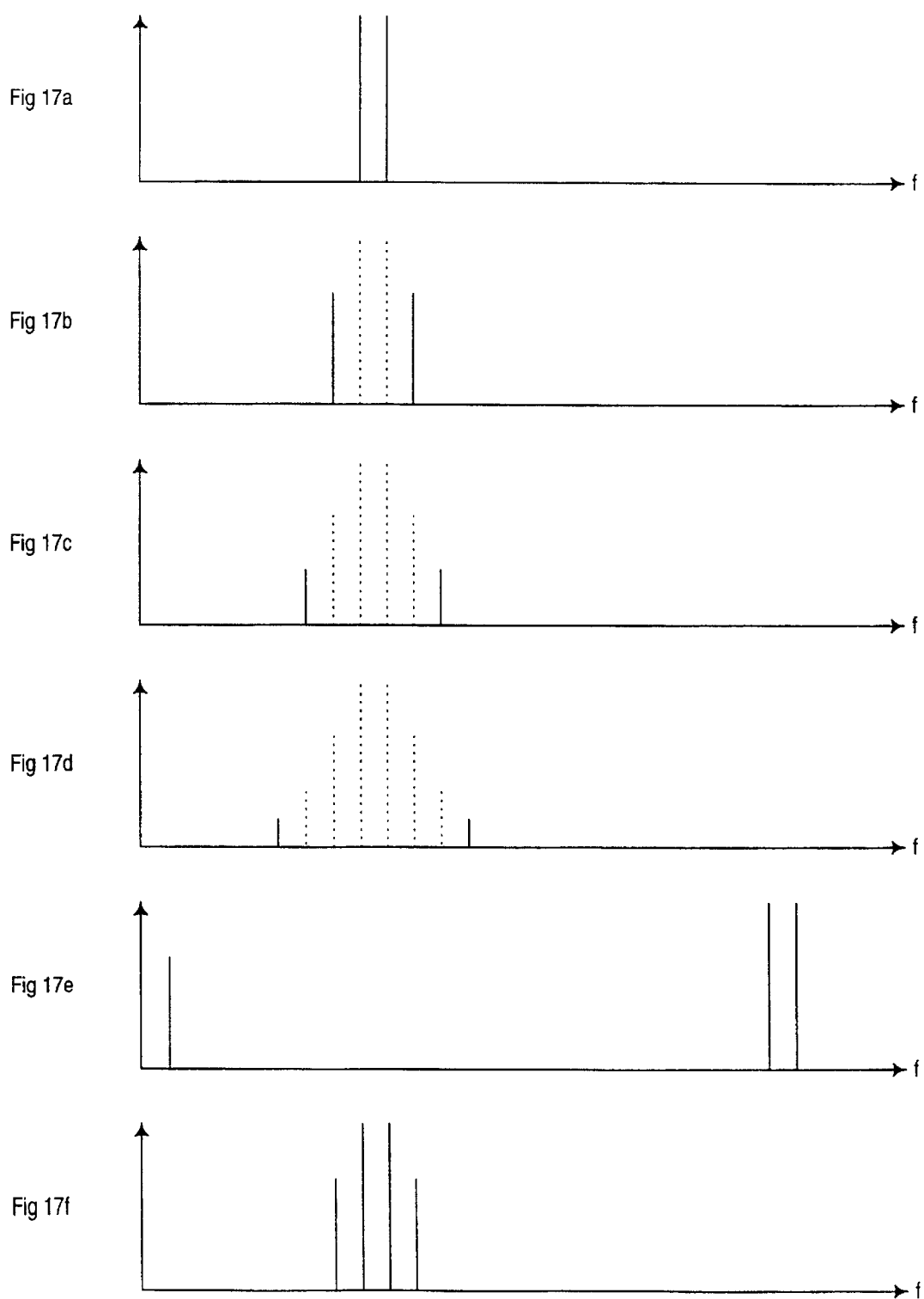
FIGS. 17a, 17b, 17c, 17d, 17e, 17f are frequency spectra for signals occurring at various points in the circuits of FIGS. 1 to 16 during use.

FIG. 11 shows a block diagram of a circuit for generating a third order distortion component. The RF input signal entering the circuit is split three ways by the splitter 405. One of the RF signals is then fed into the first input of a mixer or multiplier 410 via a directional coupler 415. The directional coupler samples a portion of the RF signal which is fed into the second input of the mixer 410 via an attenuator 420. By mixing the two versions of the same RF input signal, the output of the mixer 410 ideally generates a squared RF signal which contains frequency components in a DC zone, i.e. at low frequencies, and frequency components in a first harmonic zone, i.e. at double the original frequencies. The frequency spectra of the squared RF signal is represented in FIG. 17e.

The squared RF signal output from the mixer 410 is then fed into the first input of a mixer 425 via an attenuator 430 and a DC injection summer 435. Another RF input signal from the splitter forms the second input to the mixer 425 and may be supplied via a path 440 including a time delay element (not shown) to ensure that the two mixer input signals are in phase. By mixing the squared RF signal with the original RF input signal, the output of the mixer 425 ideally produces a pure cubic signal. The frequency spectra of the cubed RF signal is represented in FIG. 17f (after filtering to eliminate the DC-zone, harmonic and third harmonic components).

The cubed RF signal should, ideally, consist of only input RF signal energy, plus in-band third-order components. In practice however other higher orders of in-band distortion will also be present in the output of the mixer 425, together with more input signal energy than would be expected from a theoretical analysis. The attenuation values for the attenuators 420 and 430, and the coupling factor for the coupler 415 are chosen to optimise performance with the type of mixers 410 and 425. Optimum performance is a compromise between minimising the unwanted input signal energy, caused by leakage through the mixers, and minimising the higher orders of in-band distortion, caused by none-ideal performance of the mixers 410 and 425. In a circuit having a 0 dBm RF input signal level and implementing standard Gilbert-cell based silicon IC mixers, the difference between the "LO", "RF" or "IF" drive levels will typically be in the order of 20 dB in each case.

Figure 8:
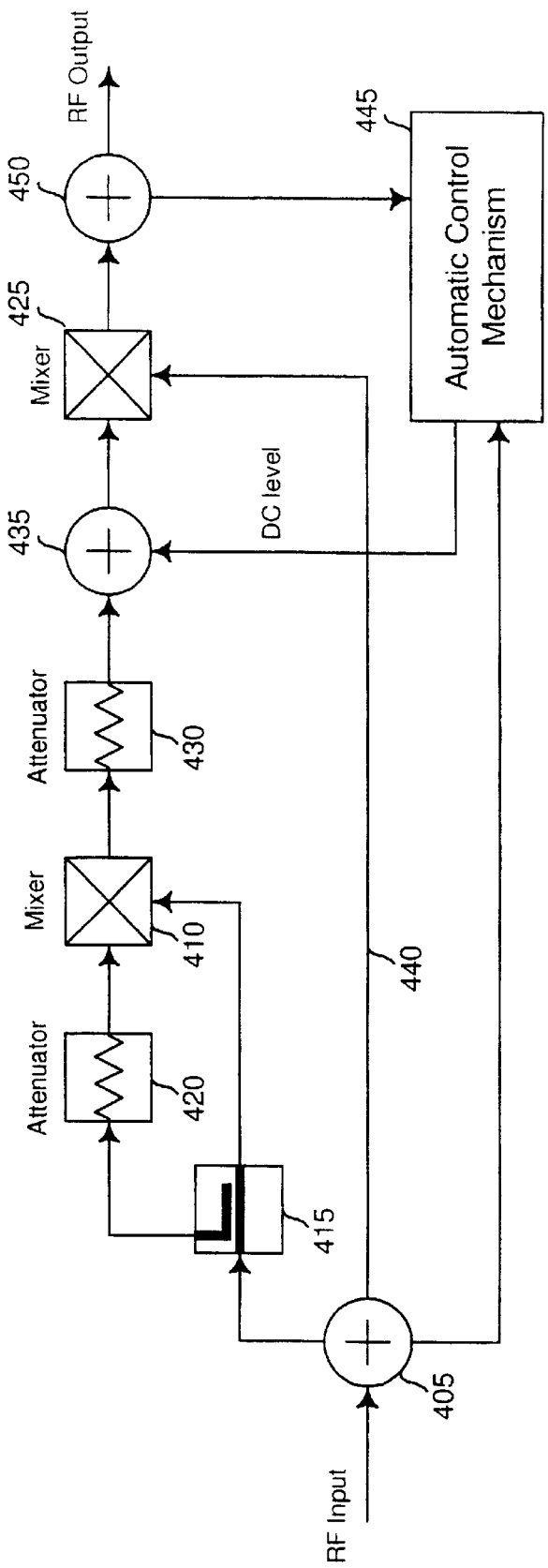
FIG. 8 is a block diagram of circuit for generating a third order distortion component suitable for use in the feed forward amplifiers of FIGS. 2, 5, 6 and 7.

In a modified version (not shown) of the third order distortion generator circuit of FIG. 8, the squared RF signal output from the mixer 410 is filtered before entering the mixer 425. This enables selection of either the DC zone frequency components of the squared RF signal by means of a low pass filter, or the second harmonic zone frequency components of the squared RF signal by means of a high pass filter. Each selection scheme has its own particular benefits, however, both schemes advantageously provide attenuation of the input tone energy at the output, when used in conjunction with the DC-based input tone rejection mechanism described below.

In the low pass filter version, the selection of the DC zone in practice provides a better behaved response in terms of gain and phase flatness than the second harmonic zone and as a result can provide better coherence between the two third order distortion components shown in FIG. 17b. Although the gain and phase flatness of the second harmonic zone version is effected by the high frequency response of the circuit elements, this version has the benefit of producing a output spectrum in which the input tone level is at a similar level to the third order distortion components, without additional correction.

In order to enable improved control of the third order component generation, it is preferable to remove as much of the input tone energy present in the output as possible. Referring to the circuit of FIG. 8, this is achieved by injecting a DC signal via an adder 435 to the squared RF signal at an appropriate level such that when mixed with the RF input signal the input energy at the output of the circuit is cancelled. The position of the DC signal injection shown in FIG. 8 is preferable as the level of RF input to the mixer 410 is relatively high and is known to a high degree of certainty. The same cancellation of the input energy can however be achieved, albeit less efficiently and less predictably, by injecting a DC signal at other positions in the distortion generation circuit. For example, an alternative position for DC injection could be into the path 440 carrying the RF input signal to the mixer 425. The DC signal would then define the leakage of a spurious RF input signal present in the squared RF signal resulting from leakage through the mixer 410. DC signal injection may also be possible in the signal paths leading to the mixer 410.

Although the DC signal level may be set to maximise cancellation of the input signal energy in the output of the distortion generating circuit, fluctuations and drifting of the various signals within the circuit will occur as a result of, for example, temperature variations of circuit components, ageing of circuit components, unpredictable variations in supply voltages, and variations in the input signal levels. The distortion generation circuit therefore includes an automatic control mechanism 445 for initialising, maintaining, and controlling the DC signal at the correct level for maximum cancellation of the input signal energy. The automatic control mechanism operates using a feedback loop principle. The output of the distortion generation circuit is sampled by a splitter 450 and is fed into an input of the control mechanism. A second input of the control mechanism receives an RF input signal from the splitter 405, preferably via a time delay element (not shown), and functions as a reference signal for the RF input. The automatic control mechanism compares the sample from the output with the RF input reference signal, and provides as an output a DC signal level dependent on the level of RF input energy detected in the output sample.

Figure 9:
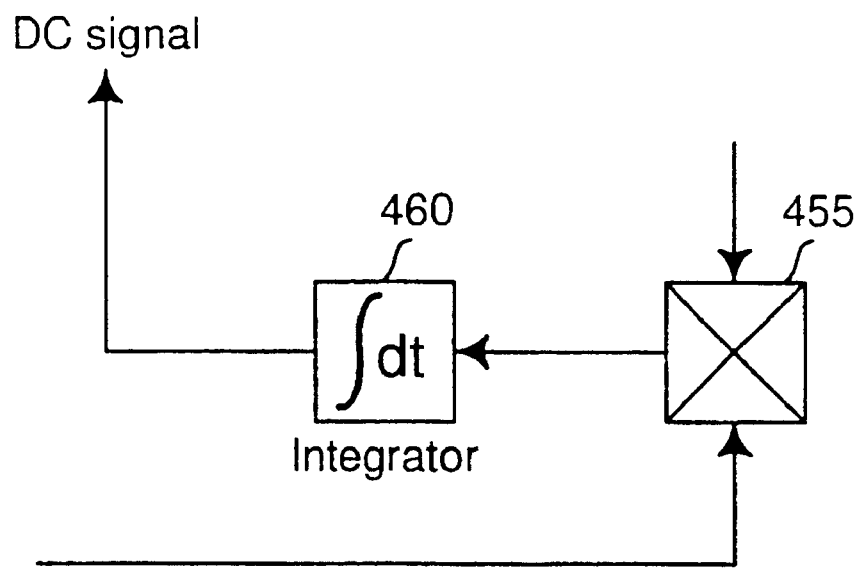
FIG. 9 is a block diagram of a feedback control circuit for use in the circuit of FIG. 8.

FIG. 9 shows one implementation of the automatic control mechanism in which a detection mixer 455 receives at one input the sample of the output signal and at another input the reference input signal. The detection mixer outputs a signal containing components across a range of frequencies. However, the output of the detection mixer of interest is the DC signal component, which provides a measure of the overlap of the unwanted input signal energy in the output with the reference input signal. This DC output is isolated from the other signal components in the detection mixer output by integration of the output in the integrator 460. The integrator has a time constant long enough to remove the unwanted non-DC signal components but short enough to provide millisecond response in the feedback. The DC output of the integrator provides the DC signal for injection into the adder 435.

A drawback with this control mechanism is that the detection mixer and the integrator may generate DC offset signals which become dominant over the feed back control DC signals. This typically occurs when the level of rejection of the input energy is in the order of 10–15 dB. It is possible to use more accurate mixers and integrators to achieve lower DC offsets to counteract this effect. However, mixers and integrators of this kind tend to be rarer and more expensive.

Figure 10:
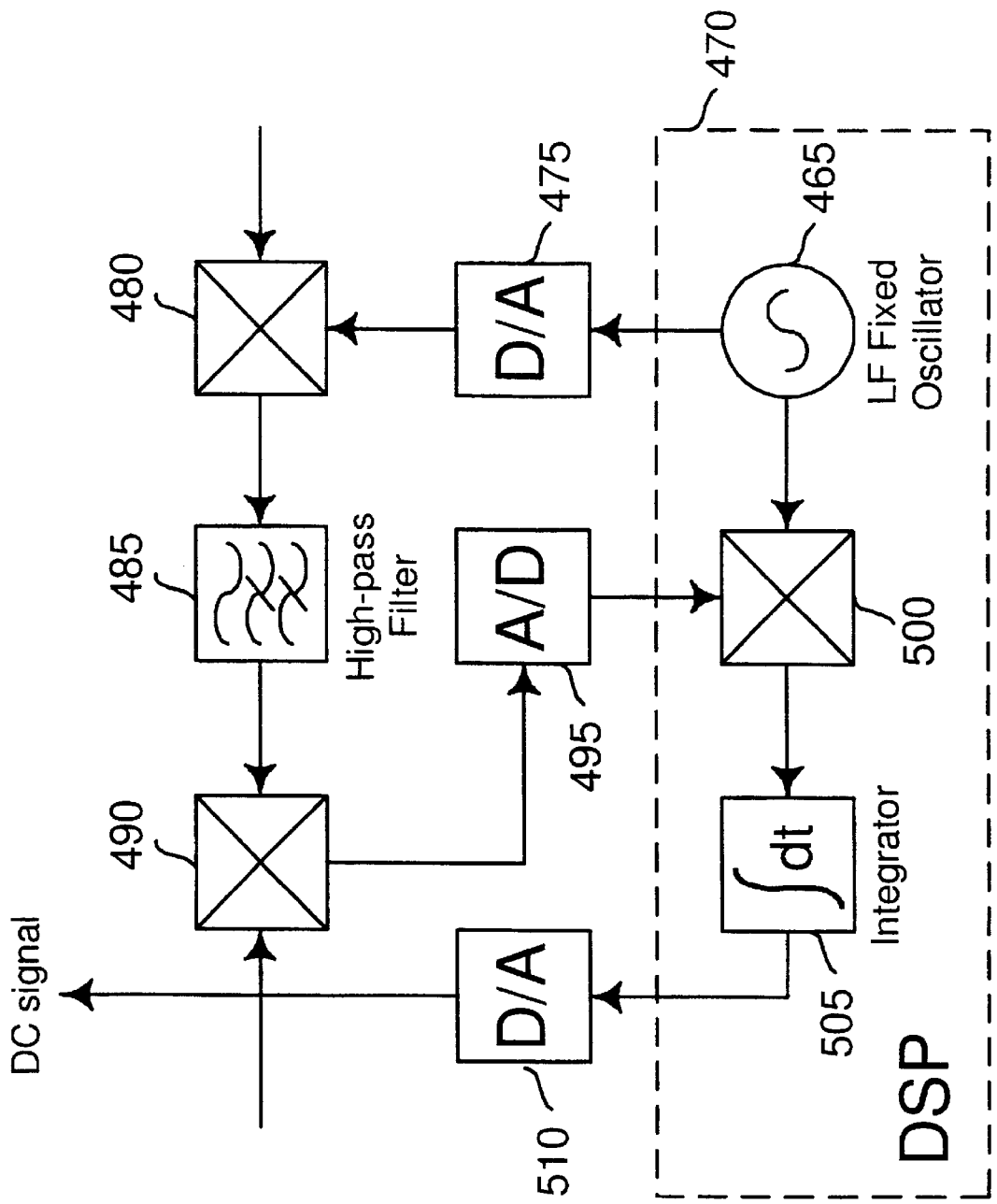
FIG. 10 is a block diagram of an enhanced feedback control circuit using digital signal processing techniques for use in the circuit of FIG. 8.

FIG. 10 shows a modified automatic control mechanism which incorporates offset frequency and digital signal processing (DSP) techniques to eliminate the DC offset problem referred to above. Although the circuit is more complex than the circuit of FIG. 9, integration of the non-DSP components on an application specific integrated circuit (ASIC) chip means that the higher component count should not add significantly to the cost of this solution. The automatic control mechanism includes the same two inputs and one output as the circuit of FIG. 9, and operates as follows. A low frequency (LF) fixed oscillator 465 operating in the digital domain of a digital signal processor (DSP) 470 provides via a digital-to-analogue converter 475 a low frequency tone signal to an input of a mixer 480. The LF tone signal is ideally at an audio frequency $f_{LF}$ of between 1 to 5 kHz. The second input to the mixer 480 is the output sample supplied by the splitter 450 shown in FIG. 8, and contains signal components at a relatively higher frequency than the LF tone signal, e.g. between 500 and 2000 MHz. The effect of mixing the output sample with the LF tone signal is to generate an image of the output sample shifted down in frequency by $f_{LF}$ and an image of the output sample shifted up in frequency by $f_{LF}$. The output of the mixer 480 is processed by a high pass filter 485 which has a cut-off frequency chosen such that the filter 485 removes any LF tone signal leaking through the mixer 480. The frequency offset output sample is then fed into an input of a detection mixer 490, whilst a second input receives the reference RE input signal. As in the mechanism of FIG. 9, the detection mixer 490 provides at its output a signal containing components across a range of frequencies. However, in this mechanism it is the signal component at the tone frequency $f_{LF}$ which provides a measure of the overlap of the unwanted input signal energy in the output with the reference input signal.

After converting the output of the detection mixer 490 back into the digital domain of the digital signal processing (DSP) using the analogue-to-digital converter 495, the signal is fed into a digital mixer 500. It should be noted that the digital signal processor and the analogue-to digital converter are ideally suited to dealing with signals at audio frequency and can therefore accurately process the required signal component at the tone frequency $f_{LF}$. The digital mixer 500 mixes the output of the detection mixer 490 with the LF tone signal from the LF fixed oscillator 465 to convert the required signal component also at the tone frequency to a DC signal. As in the mechanism of FIG. 9, this DC signal is isolated from the other signal components produced in the detection mixer by integration of the digital mixer output in a digital integrator 505. However, unlike the mechanism of FIG. 12, this offset-frequency mechanism is immune to any build up of spurious DC signals in the analogue domain, i.e. in the mixers 480, 490, the D/A 475, the A/D 495 and the high-pass filter 485. The potentially damaging DC signals enter the digital signal processor via the analogue to digital converter (AID) 495, but are immediately converted to the tone signal frequency $f_{LF}$ by the digital mixer 500 and are subsequently cancelled in the integrator 505. Because the digital mixer 500 and the integrator 505 both operate in the digital domain of the digital signal processor (DSP) they do not experience the problems of their analogue counterparts such as signal leakage or spurious DC offset generation due to temperature or power supply fluctuations. The DC signal output from the integrator provides via the digital-to-analogue converter 510 the DC signal for injection into the adder 435 of FIG. 8.

Figure 12:
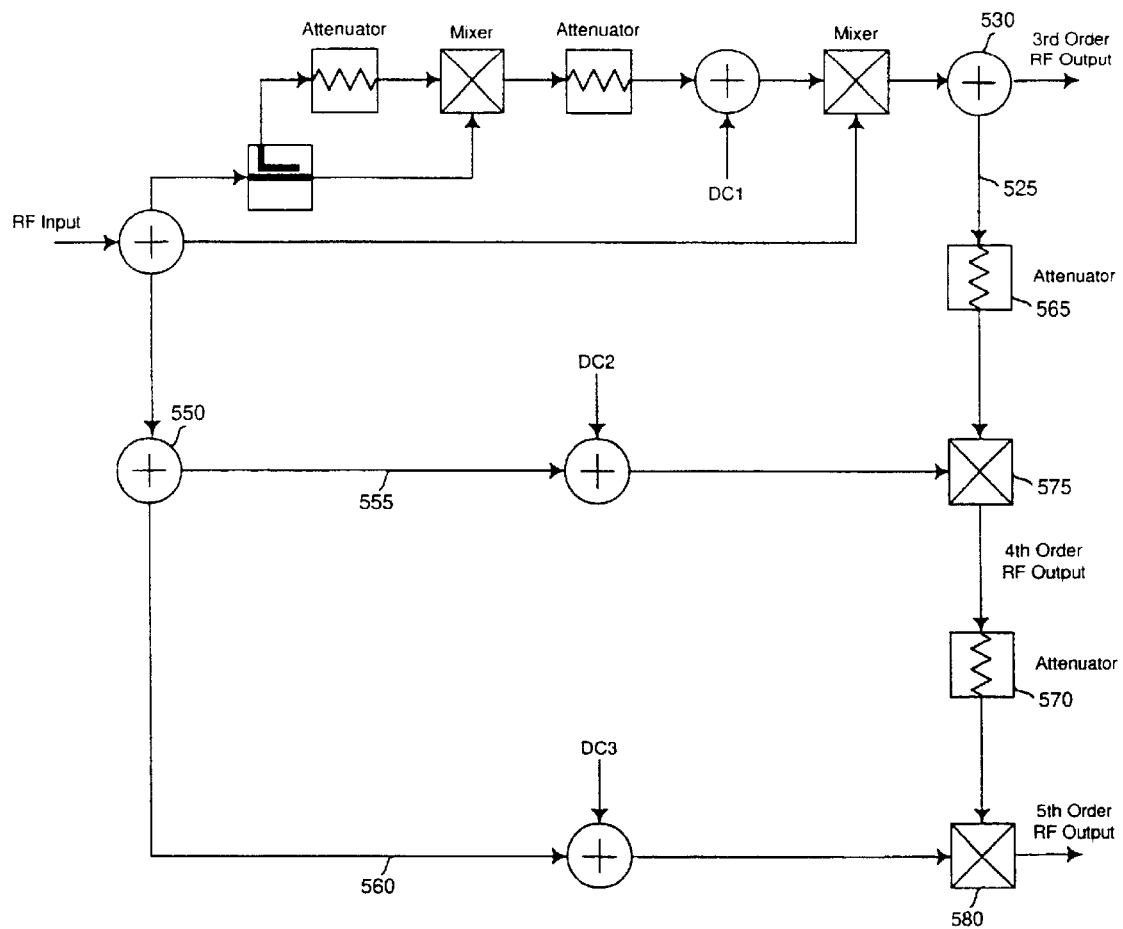
FIG. 12 is a block diagram of an alternative circuit for generating third and fifth order distortion components suitable for use in the feed forward amplifier of FIG. 6.

FIGS. 11 and 12 are block diagrams of two alternative embodiments of a circuit for generating third and fifth order distortion components, and are based on the design and basic principles of operation of the third order generation circuit of FIG. 8. Like components have therefore been labelled with like references.

Figure 14:
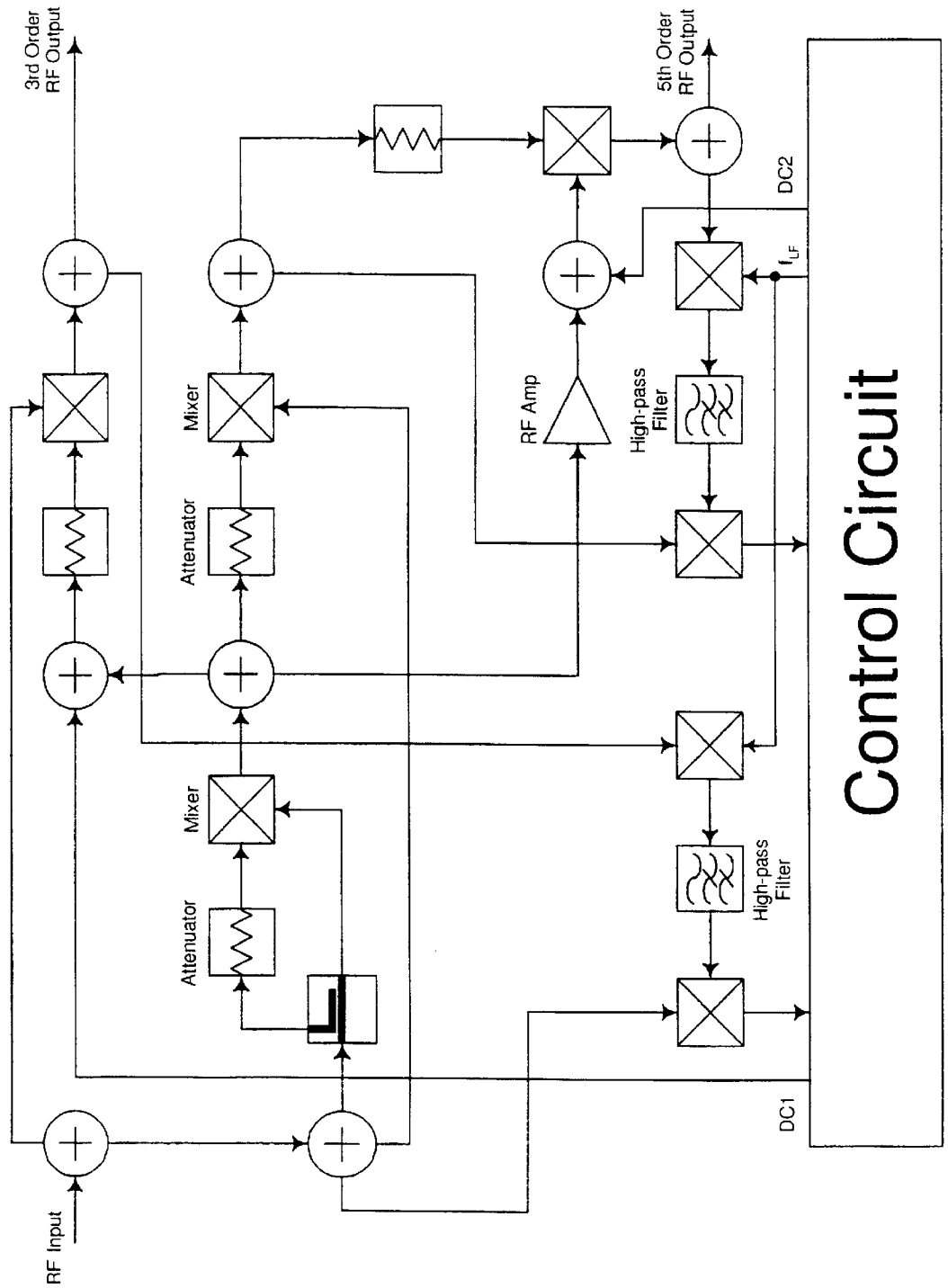
FIG. 14 is a block diagram of a circuit for generating third and fifth order distortion components, based on the circuits of FIG. 8 and FIG. 13 and including a feedback control circuit.

In the generation circuit of FIG. 14, the second order signal is divided into a second path 515 by a splitter 520, and the third order signal is divided into a second path 525 by a splitter 530. The second order signal level on the path 515, and the third order signal level on the path 525, are adjusted by an RF amplifier 535 and an attenuator 540 respectively. The adjusted second and third order signals are then mixed in the mixer 545 to produce a fifth order RF output. A second DC injection signal is added to the second order signal path 515 for mixing with the third order signal on the path 525. By adjusting the second DC signal to a suitable level, the third order signals, which would otherwise be present in the fifth order RF output, may be cancelled.

In the generation circuit of FIG. 12, the RF input signal is further divided by a splitter 550 into paths 555 and 560, and the third order signal is divided by a splitter 530 into a path 525. The third order signal is suitably attenuated by attenuators 565 and 570 which in turn feed the mixers 575 and 580. The mixers 575 and 580 mix the third order signal with the RF input signals on the paths 555 and 560 respectively. The output of the first mixer 575 generates a fourth order signal, and the output of the second mixer 580 generates the fifth order distortion signal for outputting.

Simulations performed on the generation circuit of FIG. 11 have shown that for fifth order distortion generation the first DC injection (DC1) to the adder 435 may not be required. The third DC injection can provide significant cancellation of both the main signal energy and the third order energy leaving only the desired fifth order distortion. Removal of the first and second DC injections allow for simpler control of the fifth order distortion generation, however, a drawback in this solution is that the third order output no longer contains a pure third order distortion signal.

Figure 13:
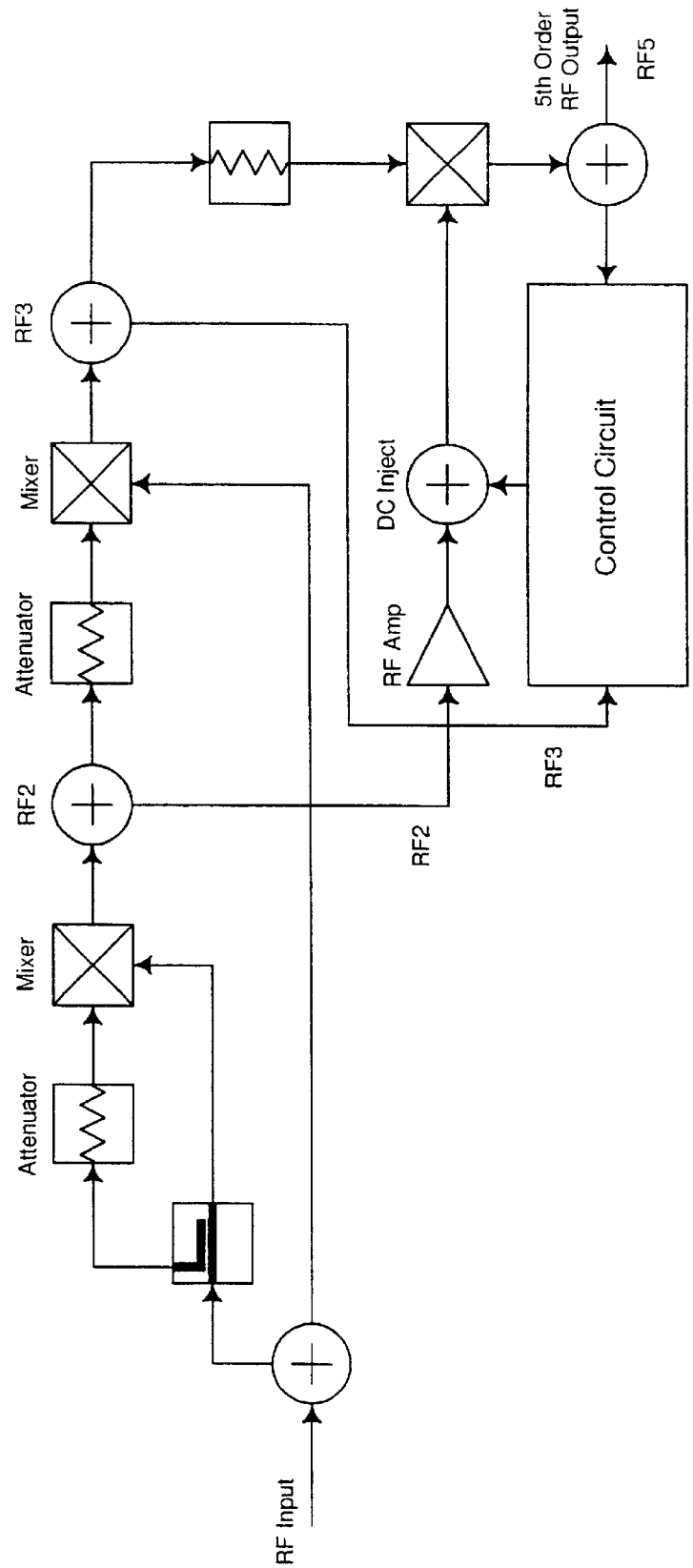
FIG. 13 is a block diagram of a circuit for generating a fifth order distortion component, based on the circuit of FIG. 11 and including a feedback control circuit.

FIG. 13 shows the circuit of FIG. 11 with a feedback control mechanism which controls and maintains the second DC injection to the adder. This feedback control mechanism performs in a similar way as in the third order generation circuit, except that a sample of the fifth order output is compared with a reference signal sampled from the third order output. The feedback DC signal therefore provides a measure of the overlap of both the unwanted input signal energy and third order signal energy in the fifth order output. The feedback control mechanism may be implemented using the feedback circuits of FIG. 9 or 10.

Figure 15:
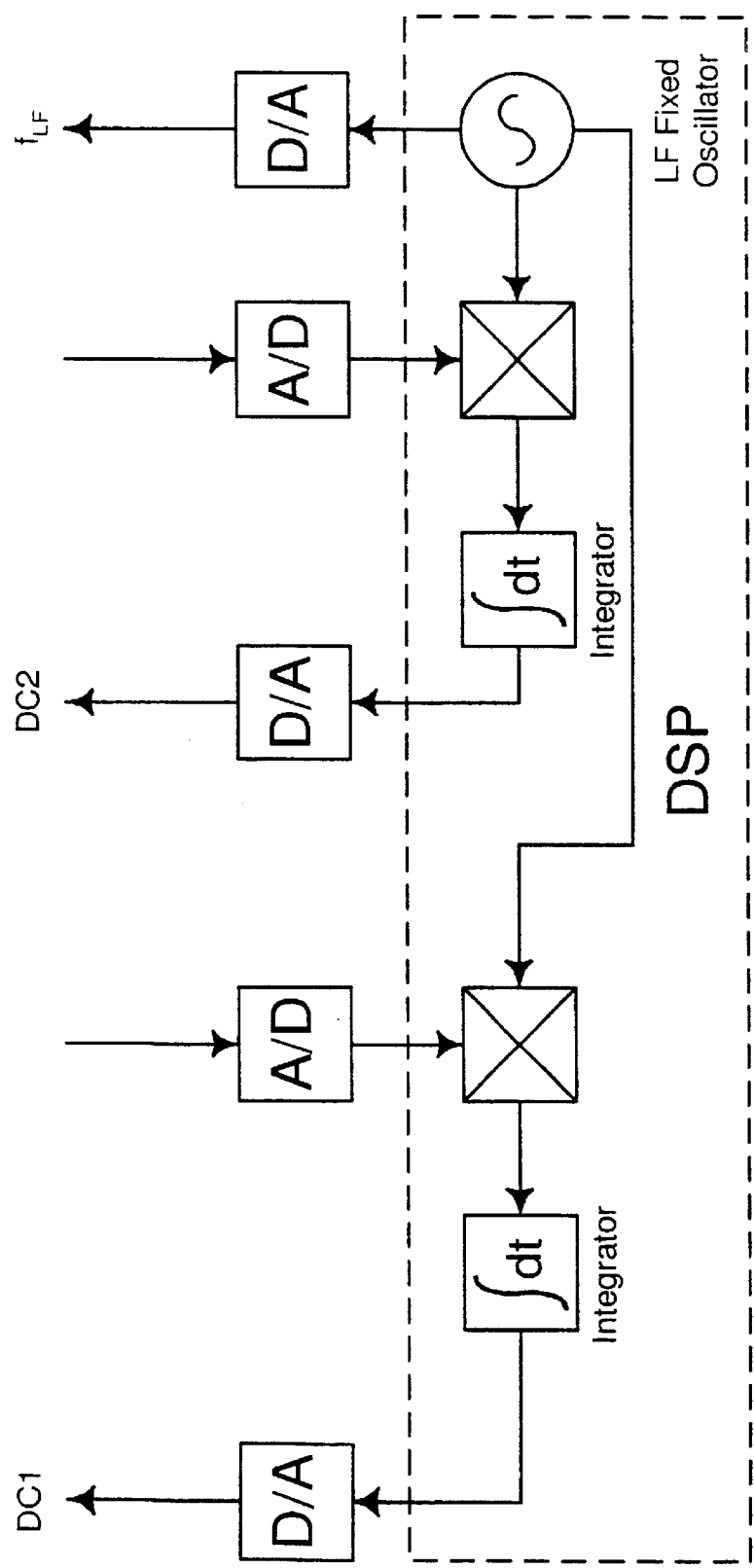
FIG. 15 is a block diagram of a feedback control circuit for use in the circuit of FIG. 14, based on the circuit of FIG. 10.

FIG. 14 is a block diagram showing a third order and a fifth order distortion generation circuit with a combined control. The circuit is a combination of the third order generation circuit of FIG. 8 and the fifth order generation circuit of FIG. 13. The combined feedback control mechanism for this circuit is shown in FIG. 15 and is based on the offset frequency mechanism of FIG. 10.

Figure 16:
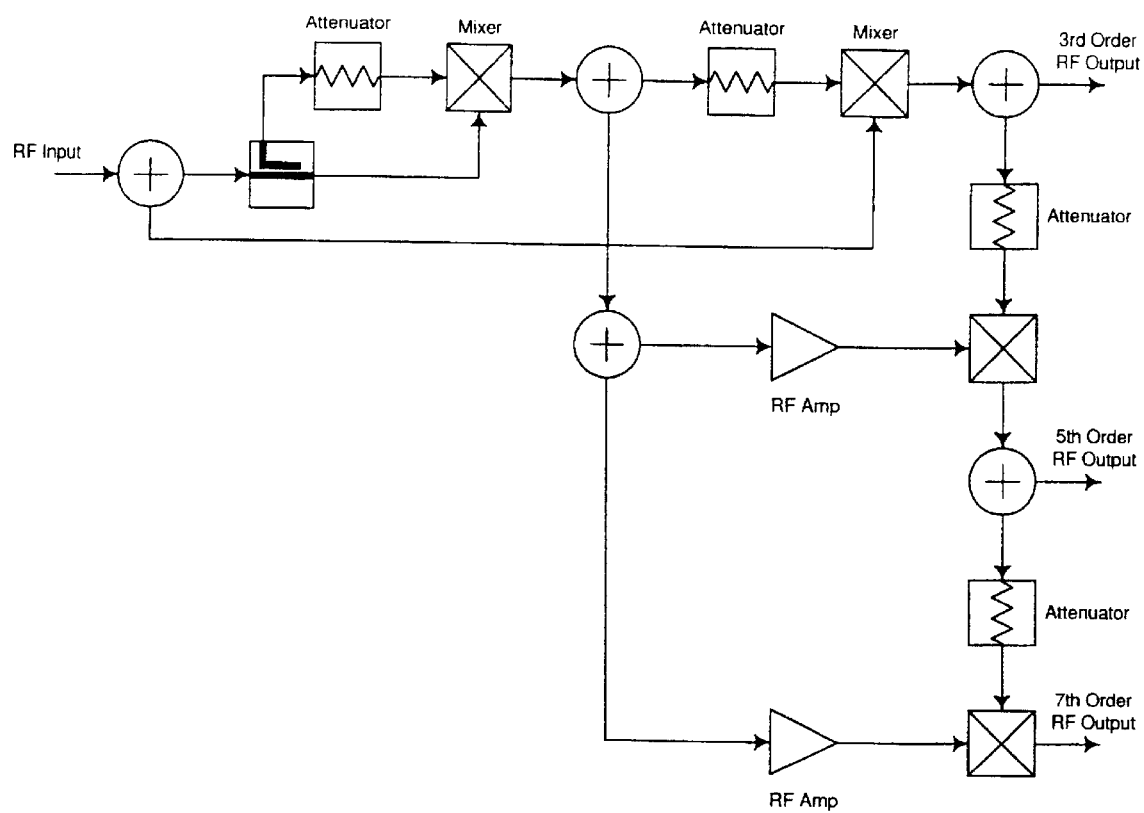
FIG. 16 is a block diagram of circuit for generating third, fifth and seventh order distortion components.

FIG. 16 is a block diagram showing a circuit for generating a seventh order distortion signal based on the principle used in the fifth order generation circuit of FIG. 11. The fifth order signal is combined with the second order signal to generate a seventh order distortion output.

It will be evident in view of the foregoing that various modifications may be made within the scope of the present invention. For example, the two DSP oscillators generating the AF and LF frequency tones could be the same oscillator generating a single tone.

What is claimed is:

1. A feed forward arrangement for linearising a distorting element having an input signal and an output signal, the feed forward arrangement having an error corrector in which a reference signal from the distorting element input signal is compared with the output signal from the distorting element to produce a first error correction signal, which is combined with the distorting element output signal to produce a corrected output signal, and in which a pilot signal is injected into the distorting element path so as to be processed by the error corrector together with the distorting element output signal, the presence of the pilot signal in the corrected output signal being monitored by comparison of the corrected output signal with the pilot signal so as to produce a second error correction signal, wherein the pilot signal is derived from the distorting element input signal.

2. A feed forward arrangement as claimed in claim 1, wherein the pilot signal is derived by modulation of the input signal with a modulating signal.

3. A feed forward arrangement as claimed in claim 1, wherein the pilot signal is derived as a third order or higher order intermodulation component of the input signal.

4. A feed forward arrangement as claimed in claim 2, wherein the input signal is attenuated in the pilot signal.

5. A feed forward arrangement as claimed in claim 1, wherein a frequency offset is applied to the pilot signal prior to being injected into the distorting element path.

6. A feed forward arrangement as claimed in claim 5, wherein the frequency offset is applied by mixing the pilot signal with a local oscillator signal.

7. A feed forward arrangement as claimed in claim 1, wherein the distorting element comprises an amplifier.

8. A feed forward arrangement as claimed in claim 7, wherein the distorting element comprises a broadband radio frequency power amplifier.

9. A feed forward arrangement as claimed in claim 1, wherein the error corrector includes an adjuster for adjusting the first error correction signal in dependence on information contained in the second error correction signal.

10. A feed forward arrangement as claimed in claim 9, wherein the adjuster enables adjustment of the first error correction signal in phase and amplitude.

11. A feed forward arrangement as claimed in claim 10, wherein the adjuster comprises a variable phase shifter and a variable attenuator.

12. A feed forward arrangement as claimed in claim 10, wherein the adjuster comprises an in-phase adjuster and a quadrature phase adjuster.

13. A feed forward arrangement as claimed in claim 1, wherein monitoring of the pilot signal in the corrected output signal comprises correlating the corrected output signal with the pilot signal.

14. A feed forward arrangement as claimed in claim 1, wherein monitoring of the pilot signal in the corrected output signal includes subtracting the input signal from the corrected output signal.

15. A feed forward arrangement as claimed in claim 6, wherein monitoring of the pilot signal in the corrected output signal includes correlating the corrected output signal with the relatively low frequency tone signal.

16. A feed forward arrangement as claimed in claim 1, wherein the reference signal is obtained from a first sample point preceding the distorting element, and the distorting element output signal is obtained from a second sample point following the distorting element, and the pilot signal is injected between the first and second sample points.

17. A feed forward arrangement as claimed in claim 1, wherein the feed forward arrangement has a second error correction means, independent of the first error correction means, which produces a third error correction signal for combining with the distorting element output signal to further correct the output signal, and in which a second pilot signal is injected into the distorting element path, the presence of the second pilot signal in the further corrected output signal being monitored by comparison with the second pilot signal so as to produce a fourth error correction signal, wherein the second pilot signal is also derived from the distorting element input signal.

18. A feed forward arrangement as claimed in claim 1, further comprising a controller in which the first error correction signal is correlated with the distortion element input signal to produce a correlation signal, the first error correction signal or the distortion element input signal being previously frequency translated by a local oscillator signal, and in which, to produce a control signal for controlling the input signal to the distorting element input or the reference signal, the correlation signal is processed in a digital signal processor by comparison with the local oscillator signal used in the frequency translation.

19. A method for linearising a distorting element having an input signal and an output signal, including a comparing step in which a reference signal from the distorting element input signal is compared with the distorting element output signal to produce a first error correction signal, a combining step in which the first error correction signal is combined with the output signal to produce a corrected output signal, and an injecting step in which a pilot signal is injected into the distorting element so as to be processed together with the distorting element output signal by the comparing step, the presence of the pilot signal in the corrected output signal being monitored by comparison with the pilot signal so as to produce a second error correction signal, wherein the pilot signal is derived from the distorting element input signal.

20. An apparatus for correcting distortion generated in a distorting element, comprising a comparator for coupling to an input and an output of the distorting element for comparing a signal from the element input with a signal from the element output to produce an error signal, a corrector, coupled to the comparator, for adjusting the error signal to produce a correction signal which is combined with the output signal of the element to produce a corrected output signal, a generator for deriving a pilot signal from the distorting element input signal, which pilot signal is a third order or higher order intermodulation component of the input signal, and a controller for comparing the corrected output signal with the pilot signal so as to produce a control signal which controls the adjustment of the error signal in the corrector.

21. A method for correcting distortion generated at an output of a distorting element having an input signal and an output signal, comprising the steps of comparing a signal from the distorting element input with a signal from the distorting element output to produce an error signal, adjusting the error signal to produce a correction signal which is combined with the output signal of the distorting element to produce a corrected output signal, deriving a pilot signal from the distorting element input signal, which pilot signal is a third order or higher order intermodulation component of the input signal, and comparing the corrected output signal with the pilot signal so as to produce a control signal which controls the adjustment of the error signal in the adjusting step.

* * * * *